(12) United States Patent
Choi et al.

(10) Patent No.: US 7,824,952 B2
(45) Date of Patent: Nov. 2, 2010

(54) DISPLAY APPARATUS AND METHOD OF MANUFACTURING THEREOF

(75) Inventors: Jae-Beom Choi, Suwon-si (KR); Young-Jin Chang, Yongin-si (KR); Kwan-Wook Jung, Suwon-si (KR); Seung-Hwan Shim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 437 days.

(21) Appl. No.: 11/689,619

(22) Filed: Mar. 22, 2007

(65) Prior Publication Data

US 2008/0121872 A1    May 29, 2008

(30) Foreign Application Priority Data

Mar. 22, 2006 (KR) ............... 10-2006-0026031

(51) Int. Cl.
 *H01L 51/40* (2006.01)
(52) U.S. Cl. ............... 438/99; 257/40; 257/59; 257/E51.018; 438/85; 438/29
(58) Field of Classification Search ............ 438/156, 438/27, 760, 166; 257/79, 200, 59, 40, E51.018, 257/E51.022
See application file for complete search history.

(56) References Cited

U.S. PATENT DOCUMENTS

2004/0065902 A1* 4/2004 Yamazaki et al. .......... 257/200
2006/0138405 A1* 6/2006 Yang et al. ................. 257/40
2006/0197086 A1* 9/2006 Rhee et al. ................. 257/59
2006/0267016 A1* 11/2006 Ahn et al. .................. 257/59

FOREIGN PATENT DOCUMENTS

CN     1638569 A     7/2005

* cited by examiner

*Primary Examiner*—Thanh V Pham
*Assistant Examiner*—Mark A Laurenzi, III
(74) *Attorney, Agent, or Firm*—Cantor Colburn LLP

(57) ABSTRACT

A display apparatus, such as an organic light emitting diode ("OLED") display, is driven by thin film transistors ("TFTs"), including a driving TFT and a switching TFT, and a pixel electrode. The display apparatus includes an amorphous silicon layer for the switching TFT and a microcrystalline silicon or polycrystalline silicon layer for the driving TFT. The amorphous silicon layer and the microcrystalline silicon layer are separated by an insulating layer. The apparatus provides product reliability and high image quality. A method of manufacturing the apparatus is characterized by reducing processing steps, and using a special mask which is a half tone mask or a slit mask adapted to forming a source electrode and a drain electrode of the switching TFT or the driving TFT and a semiconductor layer during a photolithographic process.

5 Claims, 19 Drawing Sheets

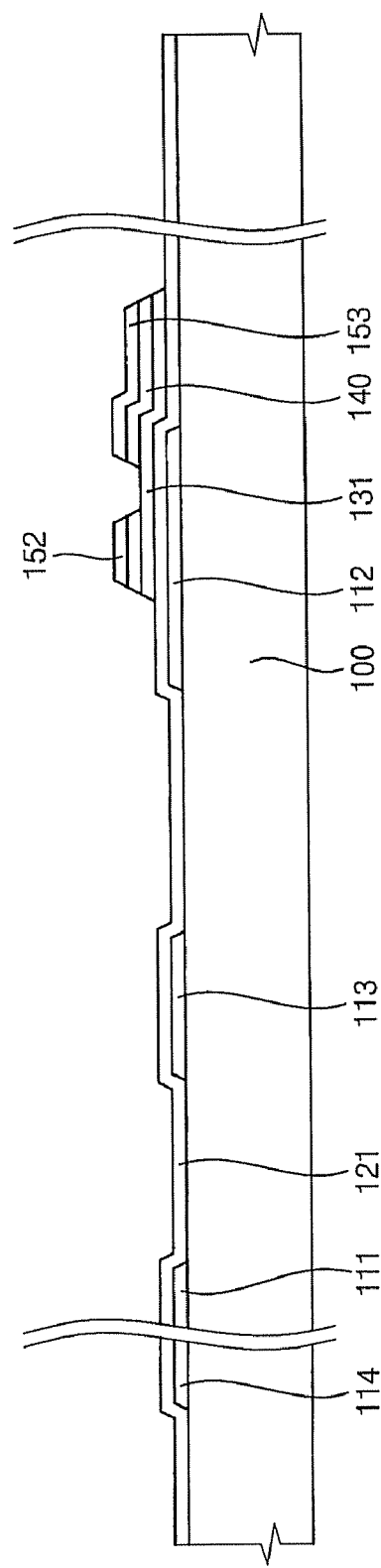

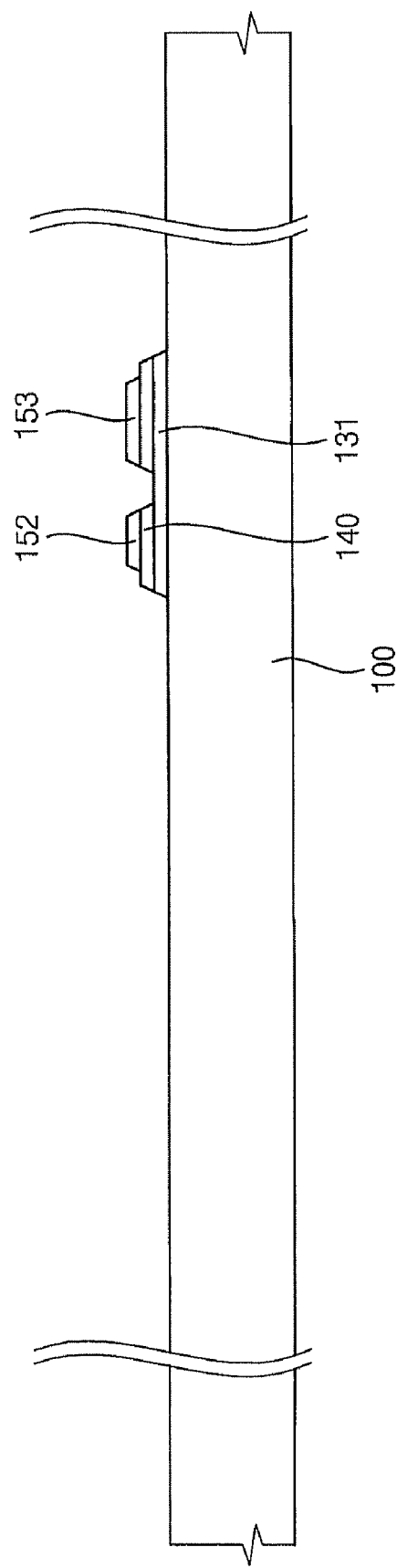

DISPLAY APPARATUS AND METHOD OF MANUFACTURING THEREOF

This application claims priority to Korean Patent Application No. 2006-26031, filed on Mar. 22, 2006 and all the benefits accruing therefrom under 35 U.S.C. §119, and the contents of which in its entirety are herein incorporated by reference.

BACKGROUND OF THE INVENTION

1. Field of the Invention

The present invention relates to a display apparatus and the method of manufacturing thereof. More particularly, the present invention relates to an organic light emitting diode ("OLED") display apparatus, which is driven by thin film transistors ("TFTs") formed on a substrate, and the method of manufacturing the TFTs on the substrate.

2. Description of the Related Art

Generally, a display apparatus is one type of interface apparatus that can help images be perceived by eyes through processing data from information sources.

There are many typical display apparatuses such as a liquid crystal display ("LCD") device, a plasma display panel ("PDP"), and an organic light emitting diode ("OLED") display apparatus. The OLED display apparatus has advantages, such as being an emissive device radiating light without a backlight, having a fast response time, and having a wide viewing angle as compared to an LCD. An OLED display apparatus includes an organic thin film sandwiched between electron injecting and hole injecting layers, and emits light by recombination of electron-hole pairs in the organic thin film that generates excitons emitting light according to their energy levels. OLED display apparatuses are divided into two kinds, a passive matrix type and an active matrix type.

In the active matrix type, an OLED display apparatus comprises a switching thin film transistor ("TFT") connected to the data signal line which controls a data voltage, and a driving TFT which controls currents of an organic layer in accordance with the data voltage received from the switching TFT. In order to achieve the best characteristic of an OLED display apparatus, the two TFTs require different characteristics from each other. For example, while the switching TFT requires relatively high on-off current ratio (I on/I off), the driving TFT requires relatively high mobility and stability for enhancing high current driving ability. If off current of a switching TFT is increased, the voltage transmitted to the driving TFT is dropped and the OLED display apparatus may generate a cross talk problem. If an OLED display apparatus has low mobility and stability of the driving TFT, the current of the organic layer is reduced, and then it may generate an image sticking problem and shorten duration time of it.

BRIEF SUMMARY OF THE INVENTION

The present invention provides a display apparatus having two kinds of thin film transistors ("TFTs") which are different from each other in the crystalline structure of the semiconductor layers used as channels. In other words, the present invention provides a display apparatus having a good product reliability and a high quality of displaying images. The present invention also increases the production yield for making a display apparatus.

According to exemplary embodiments of the present invention, the display apparatus includes a substrate, a pixel electrode, a first TFT including a first semiconductor layer on the substrate, the first TFT connected to the pixel electrode, an insulating layer over the first TFT, and a second TFT including a second semiconductor layer on the insulating layer and electrically connected to the first TFT, wherein the first TFT has a source electrode and a drain electrode formed on a top surface of the first semiconductor layer or the second TFT has a source electrode and a drain electrode formed on a top surface of the second semiconductor layer.

The first TFT may be connected to a first signal line loading a driving voltage and the second TFT maybe connected to a second signal line loading a data signal.

The first signal line may be on the top surface of the first semiconductor layer or the second signal line may be on the top surface of the second semiconductor layer.

A crystalline structure of the first semiconductor layer may be different from a crystalline structure of the second semiconductor layer. The first semiconductor layer may include a poly crystalline silicon layer or a micro crystalline semiconductor layer and the second semiconductor layer may include an amorphous silicon layer.

The source electrode of the first TFT may be connected to the first signal line, and the drain electrode of the first TFT may be connected to the pixel electrode.

The second TFT may include a gate electrode connected to a third signal line, the source electrode of the second TFT may be connected to the second signal line, and the drain electrode of the second TFT may be connected to the first TFT.

The display apparatus may further include a common electrode, and an organic layer may be disposed between the common electrode and the pixel electrode.

The first TFT may be a bottom gate type transistor, and a gate electrode of the first TFT may be disposed under the first semiconductor layer. The gate electrode of the first TFT and the gate electrode of the second TFT may be formed on the substrate. At least two insulating layers may be disposed between the gate electrode of the second TFT and the second semiconductor layer.

Alternatively, the first TFT may be a top gate type TFT, and a gate electrode of the first TFT may be formed on the first semiconductor layer. One insulating layer may be disposed between the gate electrode of the second TFT and a second semiconductor layer.

A width of a first signal line prolonged from the source electrode of the first TFT may be substantially the same as or less than a width of the first semiconductor layer, or a width of a second signal line prolonged from the source electrode of the second TFT may be substantially the same as or less than a width of the second semiconductor layer.

According to other exemplary embodiments of this invention, there is provided a display apparatus which includes a substrate, a pixel electrode, a first TFT including a first semiconductor layer and connected to the pixel electrode, and a second TFT including a second semiconductor layer and connected to the first TFT, wherein a crystalline structure of the first semiconductor layer is different from a crystalline structure of the second semiconductor layer. Moreover, the first semiconductor layer may include a poly crystalline silicon layer or a micro crystalline silicon layer and the second semiconductor layer may include an amorphous silicon layer. An insulating layer may be disposed between the first TFT and the second semiconductor layer. The first TFT may be a driving TFT and the first semiconductor layer may have higher carrier mobility and stability than the second semiconductor layer, and the second TFT may be a switching transistor and the second semiconductor layer may have a lower off current character than the first semiconductor layer.

In addition, according to still other exemplary embodiments of this invention, the display apparatus includes a substrate, a pixel electrode, a common electrode, a first TFT including a first semiconductor layer and connected to the pixel electrode, an insulating layer on the first TFT, a second TFT including a second semiconductor layer formed on the insulating layer and connected to the first TFT, and an organic layer disposed between the pixel electrode and the common electrode, wherein a gate electrode of the first TFT and a gate electrode of the second TFT are formed on a same layer of the display apparatus. In addition, the first TFT may have a source electrode and a drain electrode formed on a top surface of the first semiconductor layer or the second TFT may have a source electrode and a drain electrode formed on a top surface of the second semiconductor layer. Preferably, the first semiconductor layer may include a poly crystalline silicon layer or a micro crystalline silicon layer and the second semiconductor layer may include an amorphous silicon layer.

In yet other exemplary embodiments of this invention, there is provided the display apparatus which includes a substrate, a first semiconductor layer formed on the substrate, a source electrode and a drain electrode of a first TFT, a first insulating layer formed on the source electrode and the drain electrode of the first TFT, a gate electrode of the first TFT formed on the first insulating layer and overlapping at least a part of the first semiconductor layer, a gate electrode of a second TFT formed on the first insulating layer, a second insulating layer formed on the gate electrode of the second TFT, a second semiconductor layer formed on the second insulating layer and overlapping the gate electrode of the second TFT, a source electrode and a drain electrode of the second TFT, a connector connecting the drain electrode of the second TFT to the gate electrode of the first TFT, a pixel electrode connected to the drain electrode of the first TFT and formed on a same layer of the display apparatus as the connector, and an organic material formed on the pixel electrode. Preferably, the first TFT has a source electrode and a drain electrode formed on a top surface of the first semiconductor layer or the second TFT has a source electrode and a drain electrode formed on a top surface of the second semiconductor layer.

Further exemplary embodiments of this invention include a method of manufacturing a display apparatus, the method including forming a first gate electrode and a second gate electrode on a substrate, forming a first insulating layer on the first gate electrode and the second electrode, forming a first semiconductor layer overlapping a portion of the first gate electrode on the first insulating layer, forming a first source electrode and a first drain electrode on the first semiconductor layer, forming a second insulating layer on the first source electrode and the first drain electrode, forming a second semiconductor layer overlapping a portion of the second electrode on the second insulating layer, forming a second source electrode and a second drain electrode on the second semiconductor layer, forming a connector connecting the first gate electrode to the second drain electrode, and forming a pixel electrode, wherein the first semiconductor layer, the first source electrode, and the first drain electrode are made by a photolithographic process using a photo mask, or the second semiconductor layer, the second source electrode, and the second drain electrode are made by a photolithographic process using a photo mask. Further, forming the first semiconductor layer may include forming an amorphous silicon layer and crystallizing the amorphous silicon layer to a poly crystalline silicon layer. Preferably, the first semiconductor layer, the first source electrode, and the first drain electrode may be made by a photolithographic process using a photo mask, and the second semiconductor layer, the second source electrode, and the second drain electrode may be made by a photolithographic process using a photo mask. Moreover, the method may include forming a third insulating layer on the second source electrode and the second drain electrode and forming contact holes in the third insulating layer before forming the connector and forming the pixel electrode. Crystallizing the amorphous silicon layer to a poly crystalline silicon layer may be performed by a solid state crystallization method.

Another exemplary method of manufacturing a display apparatus includes forming a first semiconductor layer on a substrate, forming a first source electrode and a first drain electrode on the first semiconductor layer, forming a first insulating layer on the first source electrode and the first drain electrode, forming a first gate electrode on the first insulating layer, the first gate electrode overlapping a portion of the first semiconductor layer, and forming a second gate electrode on the first insulating layer, forming a second insulating layer on the first gate electrode and the second electrode, forming a second semiconductor layer on the second insulating layer, the second semiconductor layer overlapping a portion of the second gate electrode on the second insulating layer, forming a second source electrode and a second drain electrode on the second semiconductor layer, forming a connector connecting the first gate electrode to the second drain electrode, and forming a pixel electrode, wherein the first semiconductor layer, the first source electrode, and the first drain electrode are made by a photolithographic process using a photo mask, or the second semiconductor layer, the second source electrode, and the second drain electrode are made by a photolithographic process using a photo mask. Further, the first semiconductor layer may be made by forming an amorphous silicon layer and crystallizing the amorphous silicon layer to a poly crystalline silicon layer. Preferably, the first semiconductor layer, the first source electrode, and the first drain electrode may be made by a photolithographic process using a photo mask, and the second semiconductor layer, the second source electrode, and the second drain electrode may be made by a photolithographic process using a photo mask. Moreover, the method may include forming a third insulating layer on the second source electrode and the second drain electrode and forming contact holes in the third insulating layer before forming the connector and forming the pixel electrode. Crystallizing the amorphous silicon layer to a poly crystalline silicon layer may be performed by a solid state crystallization method.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE INVENTION

Figure 1:
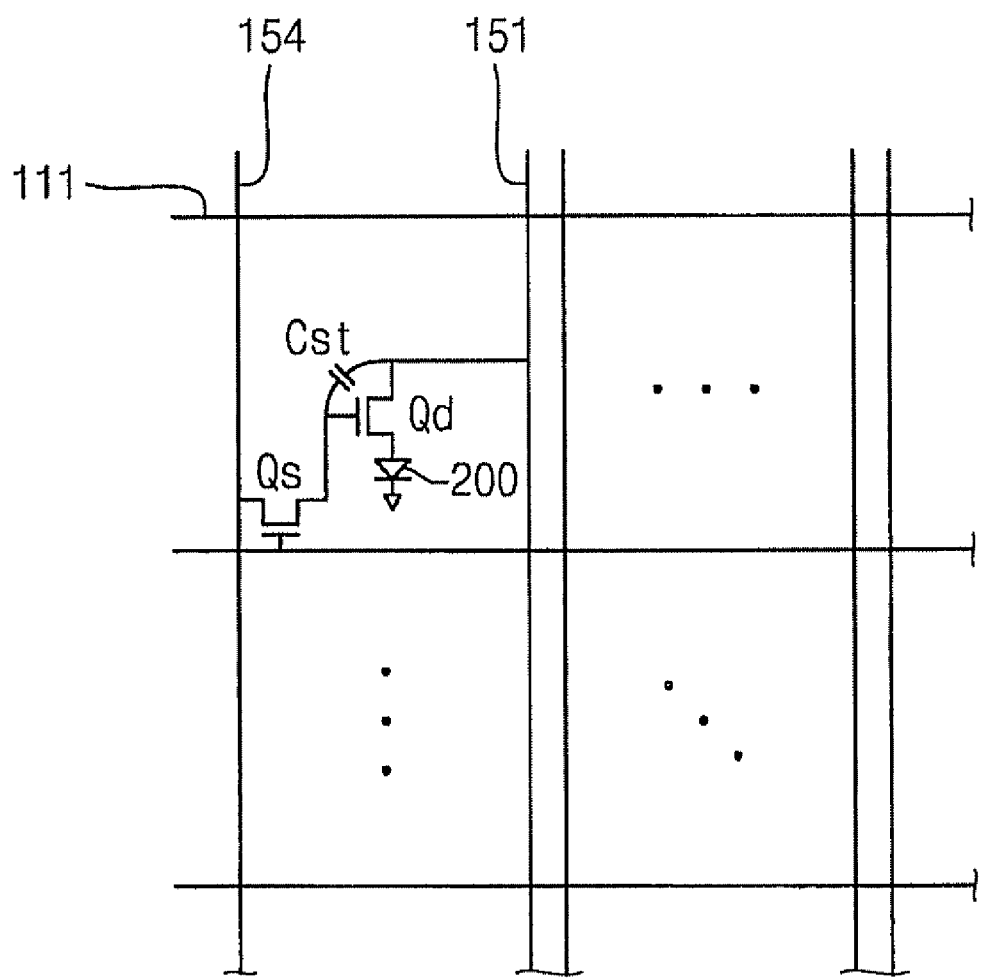
FIG. 1 illustrates schematically an arrangement of a pixel portion of an exemplary OLED display apparatus according to an exemplary embodiment of the present invention using an equivalent circuit.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A display apparatus and a method of manufacturing thereof according to preferred embodiments of the present invention will be described herein below with reference to FIG. 1 to FIG. 15.

FIG. 1 illustrates schematically an arrangement of an exemplary pixel portion of an exemplary OLED display apparatus according to an exemplary embodiment of the present invention using an equivalent circuit.

Referring to FIG. 1, the display apparatus includes a plurality of signal lines 111, 151, 154, and a plurality of pixels PX electrically connected to the signal lines through thin film transistors ("TFTs") Qs, Qd, and arranged in a matrix figure.

The signal lines include a plurality of gate signal lines 111 transferring gate signals (or scanning signals), a plurality of data signal lines 154 transferring data signals, and a plurality of driving voltage lines 151 supplying a power. The gate lines 111 run horizontally in parallel with each other and the data signal lines 154 and the driving voltage lines 151 run vertically in parallel with each other.

Each of the pixels PX includes a pixel electrode, a switching TFT Qs, a driving TFT Qd, a storage capacitor Cst, and an organic light emitting diode ("OLED") 200.

The switching TFT Qs includes a gate electrode, a source electrode, and a drain electrode, each of which is connected to the gate signal line 111, the data signal line 154, and the driving TFT Qd, respectively. The switching TFT Qs transfers the data signal to the driving TFT Qd.

The driving TFT Qd includes a gate electrode, a source electrode, and a drain electrode also, each of which is connected to the drain electrode of the switching TFT Qs, the driving voltage line 151, and an OLED 200, respectively.

The capacitor Cst is connected to the gate electrode and the source electrode of the driving TFT Qd. The capacitor sustains a voltage level loaded to the gate electrode of the driving TFT Qd for a frame period after the switching TFT Qs is turned off.

The OLED 200 emits light varied by the electric current intensity according to the output voltage of the driving TFT Qd.

The switching TFT Qs and the driving TFT Qd are n-channel field effect transistors "FETs" or one of them may include a p-channel FET. While a particular arrangement is shown, there may be many modifications due to the connecting relations among the TFTs, the capacitor Cst, and the OLED 200.

Referring to FIG. 2 through FIG. 9, a constitution of the display apparatus and a method of manufacturing thereof will be described according to an exemplary embodiment of this invention.

Figure 2:
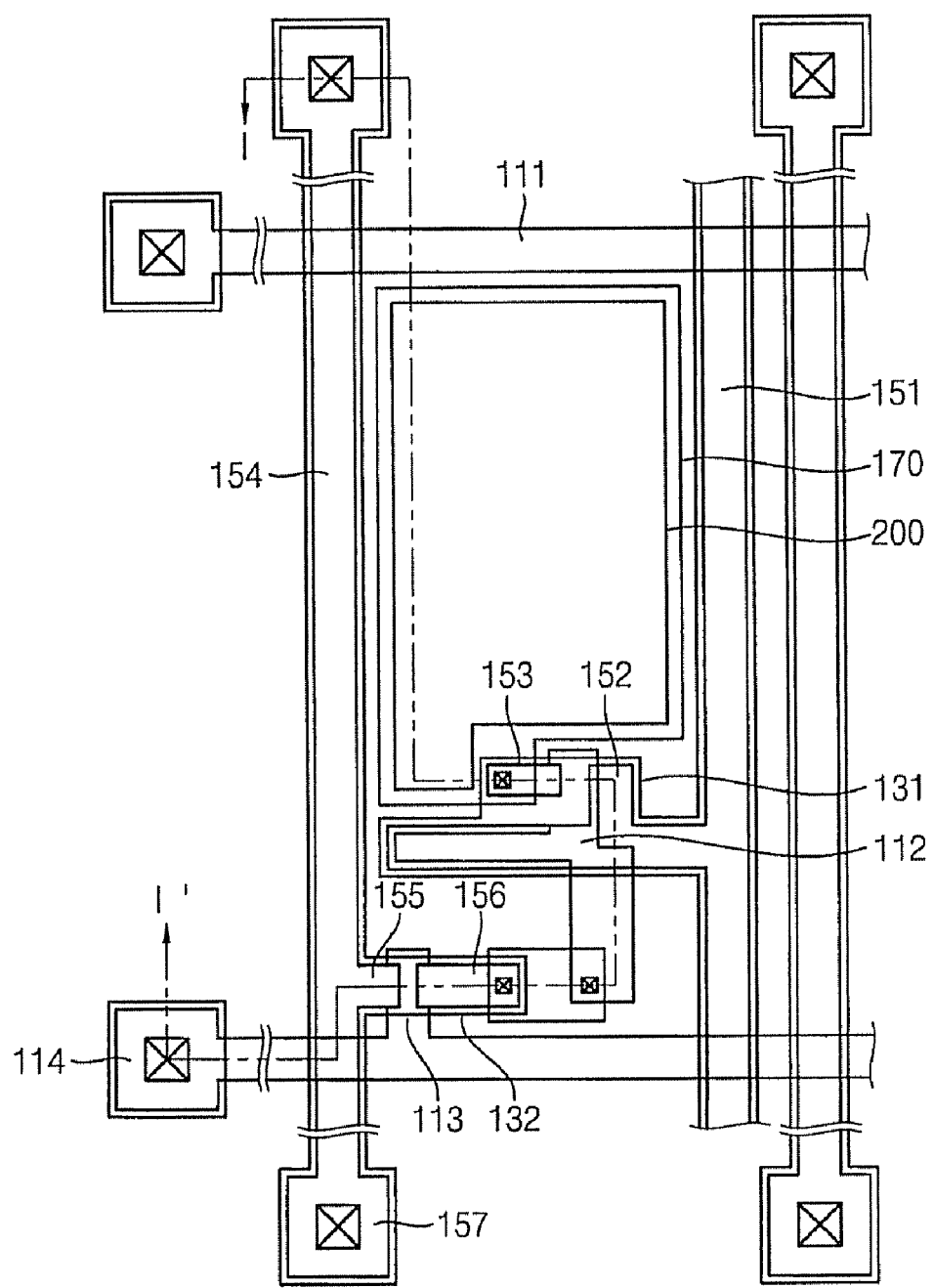
FIG. 2 is a layout showing an arrangement of the exemplary OLED display apparatus shown in FIG. 1.
Figure 3:
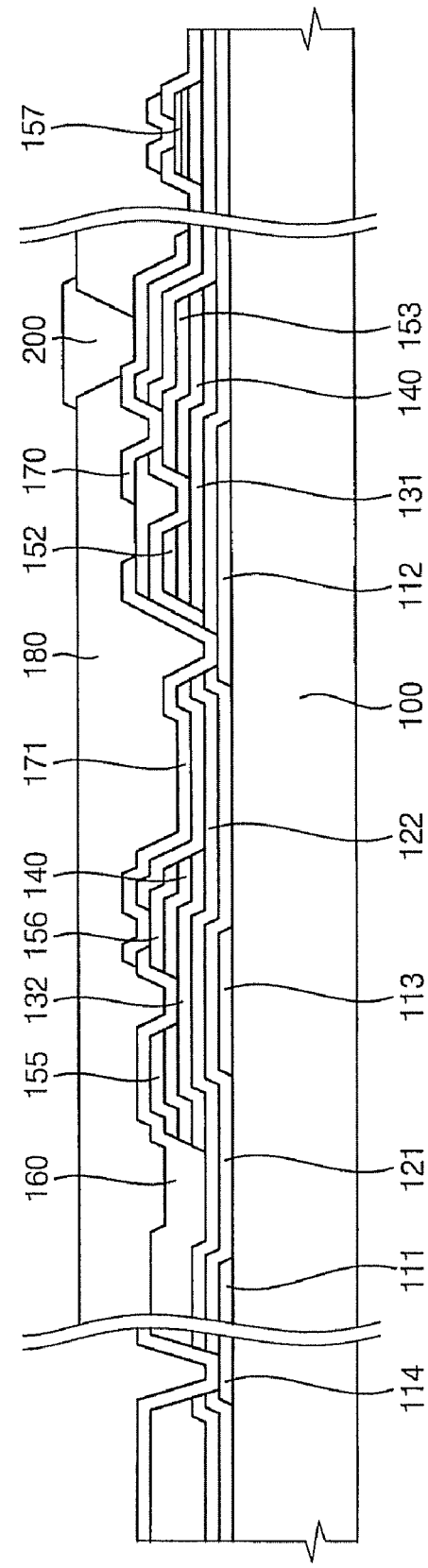
FIG. 3 is a cross sectional view of the exemplary OLED display apparatus taken along line I-I' shown in FIG. 2 according to an exemplary embodiment of this invention.

FIG. 2 is a layout showing an arrangement of the exemplary OLED display apparatus shown in FIG. 1. FIG. 3 is a cross sectional view of the exemplary OLED display apparatus taken along line I-I' shown in FIG. 2.

As shown in FIG. 2 and FIG. 3, TFTs in the embodiment are bottom type TFTs, the gate electrodes of which are formed under a gate insulating layer. In detail, a gate electrode 112 of a driving TFT Qd, a gate electrode 113 of a switching TFT Qs, gate lines 111, and gate terminals 114 are formed on a transparent substrate 100 such as glass, plastic, etc. The gate electrode 112 of the driving TFT Qd controls turning on or turning off the driving TFT Qd by the data voltage transferred through the switching TFT Qs. Moreover, the gate electrode 112 is connected to an electrode of a storage capacitor Cst that is extended from the gate electrode 112. The electrode of the storage capacitor is overlapped with another electrode of the storage capacitor extended from the source electrode 152 of the driving TFT Qd or the driving voltage line 151, intervened by an insulating layer between two electrodes not shown in detail in FIG. 2 or 3. The gate electrode 113 of a switching TFT Qs is connected to one of the gate lines 111 that run horizontally. The gate electrode 113 controls turning on or off the switching TFT Qs according to the gate signals from the gate line 111. Gate pads are formed on the gate terminals 114, on one terminal or two terminals of the gate signal lines 111, in order to connect to the output of a driving integrated circuit ("IC") chip or a driving circuit including TFTs on the substrate.

As shown in FIG. 3, a gate insulating layer 121 is deposited over the gate lines 111, the gate electrode 112 of the driving TFT Qd, and the gate electrode 113 of the switching TFT Qs, and is made of silicon nitride SiNx or silicon oxide SiOx. The gate insulating layer 121 may be further formed on exposed surfaces of the substrate 100.

A semiconductor layer 131 is formed on the gate insulating layer 121, and is made of micro crystalline silicon or poly crystalline silicon. The semiconductor layer 131 is overlapped with the gate electrode 112, intervened by the gate insulating layer 121, and the overlapped portion constitutes channel regions of the driving TFTs Qd. Ohmic contact layers 140 which are made of highly doped n-type semiconductor layer, which is made of phosphor-doped amorphous silicon ("a-Si"), microcrystalline silicon, or polycrystalline silicon, are formed in direct contact with the top surface of the semiconductor layer 131. In addition, a source electrode 152 and a drain electrode 153 of the driving TFTs Qd, and a voltage driving signal line 151 are formed on the ohmic contact layers 140, and the width of a source electrode 152 and a drain electrode 153 of the driving TFTs Qd, and a voltage driving line 151 measured at any point is as same or less than the semiconductor layer 131 directly underneath them The source electrode 152 of the driving TFT Qd is connected to the driving voltage line 151 and extended from it. The drain electrode 153 of the driving TFT Qd faces the source electrode 152 of the driving TFT Qd opposite to the channel. The driving voltage line 151 runs vertically and supplies electric currents to the source electrodes 152 of the driving TFTs.

A passivation layer 122 which is made of silicon nitride SiNx or silicon oxide SiOx is formed over the semiconductor layer 131, the source electrode 152, and the drain electrode 153 of the driving TFTs Qd. The passivation layer 122 protects the TFTs, especially the channels of the TFTs. The gate electrode 113 of the switching TFT Qs is formed on the substrate 100 on which the gate electrode 112 of the driving TFT Qd is formed. So, the gate electrode 113 is covered with the gate insulating layer 121 and the passivation layer 122. Another semiconductor layer 132 which is made of hydrogenated a-Si is formed on the passivation layer 122 in order to constitute channels of the switching TFTs Qs. In other words, the gate insulating layer of the switching TFTs Qs includes two insulating layers, the gate insulating layer 121 and the passivation layer 122.

Similar to the driving TFTs Qd, the other elements of the switching TFTs Qs include the semiconductor layer 132 including the channels, ohmic contact layers 140, source electrodes 155 and drain electrodes 156, and data signal lines 154. The data signal lines 154 include wide end portions or terminals 157 that are connected to data pads. Herein, the width of the source electrodes 155 and the drain electrodes 156 of the switching TFTs Qs, and the data signal line 154, measured at any point, is the same as or less than that of the underlying semiconductor layer 132. The drain electrode 156 of the switching TFT Qs is electrically connected to the gate electrode 112 of the driving TFT Qd through a connector 171 which is made of the same material as that of pixel electrodes 170. The switching TFT Qs controls the turning on or turning off of the driving TFT Qd by transferring data voltages from the data signal line 154 to the gate electrode 112 of the driving TFT Qd according to the gate signal loaded to the gate electrode 113 of the switching TFT Qs.

Another passivation layer 160 which is made of silicon nitride SiNx or silicon oxide SiOx is formed on the semiconductor layer 132 and the switching TFT Qs, as well as on exposed portions of the passivation layer 122. In addition, a pixel electrode 170 and a connector 171 are formed on the passivation layer 160. The connector 171 connects the gate electrode 112 of the driving TFT Qd to the drain electrode 156 of the switching TFT Qs through two contact holes, one of which penetrates the two insulating layers 121, 122 and the passivation layer 160 to expose the gate electrode 112 and the other penetrates the passivation layer 160 to expose the drain electrode 156. The pixel electrode 170 is connected to the drain electrode 153 of the driving TFT Qd through a contact hole which penetrates the two passivation layers 122, 160.

The pixel electrode 170 transfers electric current to the OLED material 200 from the driving voltage line 151 and plays a role as an anode to provide the OLED material 200 with electric holes.

An insulating partition 180 is formed on the passivation layer 160 and the pixel electrode 170. The insulating partition 180 covers the gate line 111, the driving voltage line 151, the data signal line 154, the switching TFT Qs, the driving TFT Qd, and a peripheral portion of the pixel electrode 170. Therefore, an OLED material 200 is formed on the area that is not covered with the insulating partition 180 on the pixel electrode 170. Typical materials for the insulating partition 180 include an organic insulating material such as acrylic resin or polyimide resin characterized as its thermal resistance and chemical resistance, or an inorganic insulating material such as silicon dioxide $SiO_2$ and titanium dioxide $TiO_2$. Alternatively, two or more layers may be available for the insulating partition 180 and a photosensitive material dispersed with black pigments may be used as well.

As described above, the crystalline structure of the semiconductor layer 132 used as the channel of the switching TFT Qs is different from that of the semiconductor layer 131 used as the channel of the driving TFT Qd. The poly crystalline silicon layer or micro crystalline silicon layer suits the material requirements for the driving TFT Qd due to high carrier mobility and stability. The a-Si layer suits the material requirements for the switching TFT Qs due to low off current character compared to that of a poly crystalline or a micro crystalline silicon layer. The luminescence of the OLED material 200 is in proportion to the current intensity. Therefore, the driving TFT Qd needs stable and high mobility character. However, the switching TFT Qs needs low off current character to sustain the voltage of the gate of the driving TFT Qd for a frame period.

The OLED 200 device includes an anode, (the pixel electrode 170), a hole injection layer (not shown), an emitting layer (not shown), and a cathode (not shown). So, the OLED material 200 refers to all of the OLED device or a part of it generally. However, in this specification the OLED material refers to layers which include a hole injection layer, an emitting layer, which is made of an organic layer for example, Alq3 (tri(8-hydroxyquinoline) aluminum), and electron transmitting layer or an emitting layer only. The cathode is called a common electrode (not shown) to supply electrons to the emitting layer.

While the illustrated display apparatus shows a pixel including a driving TFT Qd and a switching TFT Qs, this invention may adapt to other modifications that add more TFTs and connectors in order to prevent deteriorating TFTs and enhancing durability of apparatuses.

Referring to FIG. 4 through FIG. 9, the exemplary method of manufacturing an exemplary display apparatus according to the exemplary embodiment shown in FIG. 3 will be described below.

Figure 4:
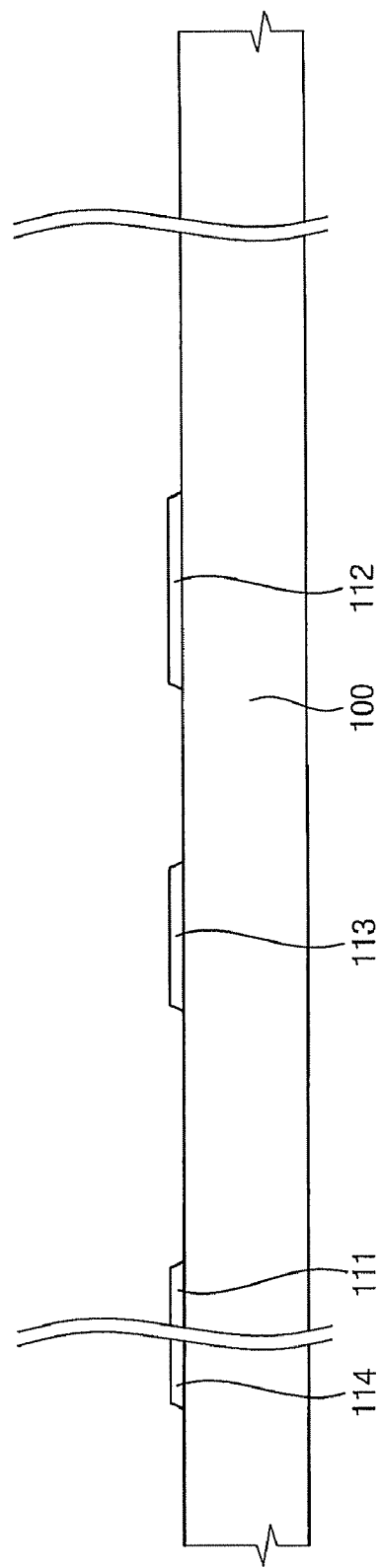
FIG. 4 through FIG. 9 illustrate an exemplary method of manufacturing the exemplary display apparatus shown in FIG. 3 by cross sectional views.

A metal layer is formed on a transparent substrate 100 such as by a sputtering method, and then gate lines 111, gate terminals 114, gate electrodes 112 of driving TFTs Qd, and gate electrodes 113 of switching TFTs Qs are patterned by a first photo lithographic process as shown in FIG. 4.

Figure 5:
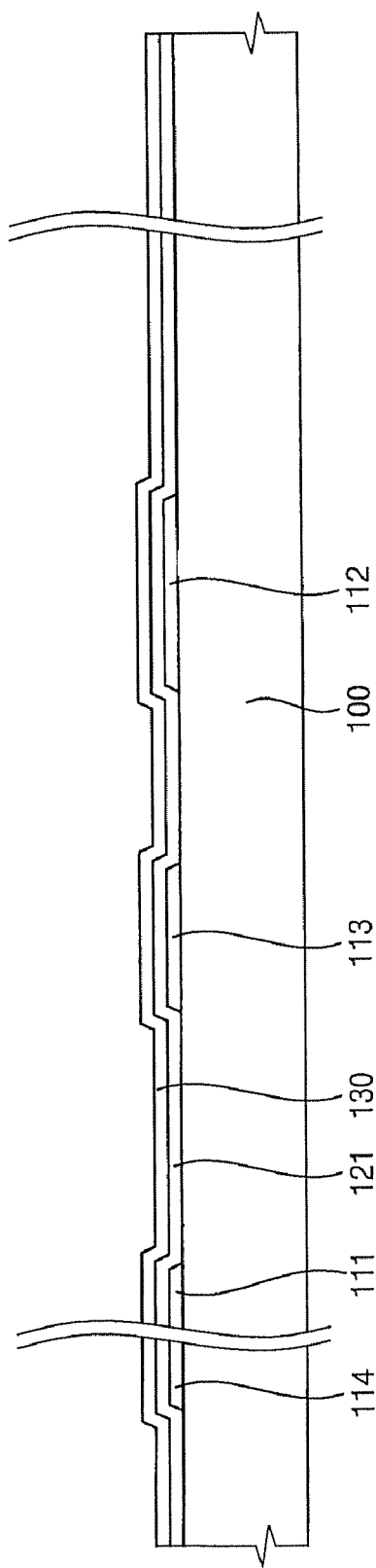

As shown in FIG. 5, a silicon nitride layer as an insulating layer 121 and an a-Si layer 130 for the semiconductor layer 131 are deposited sequentially on the gate lines 111, the gate terminals 114, the gate electrodes 112 of driving TFTs Qd, and the gate electrodes 113 of switching TFTs Qs, as well as on exposed surfaces of the substrate 100. In order to change the crystalline structure of the a-Si layer 130 to a poly crystalline silicon layer or a micro crystalline silicon layer, preferably a solid phase crystalline ("SPC") method may be used, in which the a-Si layer 130 is treated by heating in a furnace for 4 min through 5 hours at 450~700° C. Within the heating time, the a-Si layer 130 is changed to a microcrystalline silicon layer, the grain size of which is under a micron, or a poly crystalline silicon layer, the grain size of which is over a micron. Other well-known crystallizing methods may be used to crystallize the a-Si layer 130, for example, rapid thermal annealing ("RTA") method, excimer laser annealing ("ELA") method, and etc.

Figure 6A:
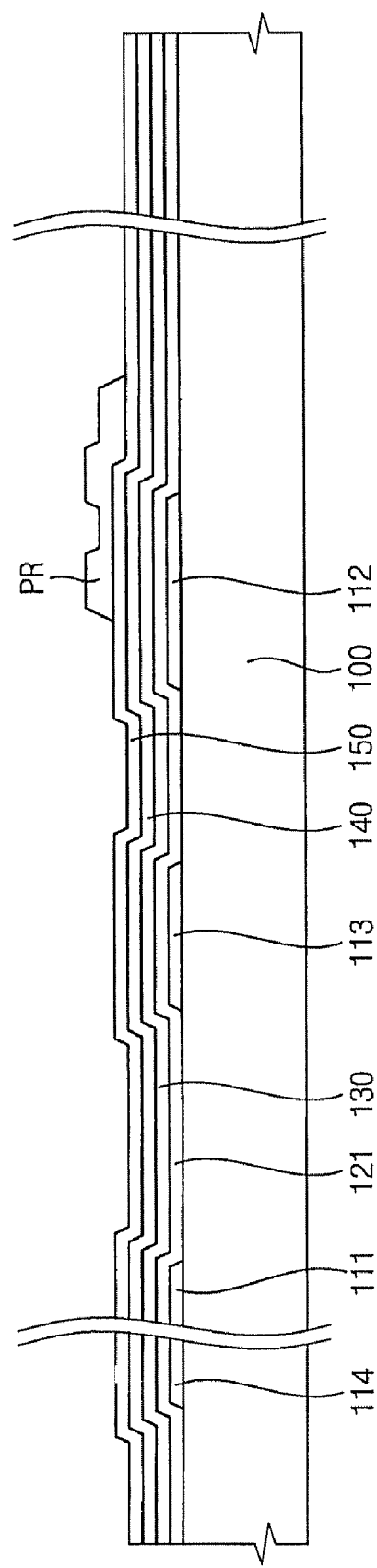
Figure 6B:
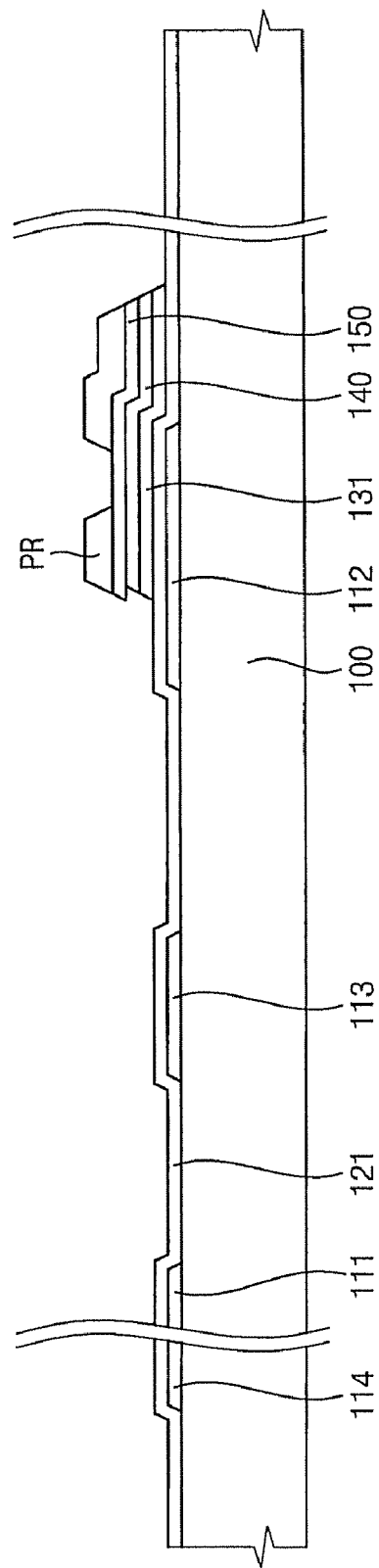

As shown in FIG. 6A, an n+ a-Si layer, an n+ microcrystalline silicon layer, or an n+ polycrystalline silicon layer as an ohmic contact layer 140 is deposited on the microcrystalline silicon layer or the poly crystalline silicon layer 130 by chemical vapor deposition ("CVD") method and/or a crystallization process. A metal layer 150, for example molybdenum Mo, titanium Ti, Mo/aluminum Al/Mo or chromium Cr, is deposited on the ohmic contact layer 140 by sputtering method. As shown in FIGS. 6A, 6B, and 6C, the source and drain electrodes 152, 153 of the driving TFT Qd, the semiconductor layer 131, and the ohmic contact layer 140 may be patterned by a single photolithographic process.

Patterning by a single photolithographic process is done by using a special mask that allows for partial diffractive exposure of the positive photo resist PR coated on the metal layer 150 in the channel region of the driving TFT Qd. The mask has a portion with slit patterns or a half tone pattern. After being exposed and developed, the photo resist PR is patterned as shown as FIG. 6A. The height of the photo resist PR on the region where the channel will be located is lower than the regions where the source electrode 153 and drain electrode 152 will be located. The metal layer 150, the ohmic contact layer 140, and the semiconductor layer 131 are etched by a wet or dry etching method and the photo resist pattern PR is sequentially etched back as shown in FIG. 6B. The metal layer 150 and the ohmic contact layer 140 are etched away in the portion on the channel, masked by the photo resist pattern PR as shown in FIG. 6B. FIG. 6C is a delineated driving TFT Qd pattern after the photo resist PR pattern is stripped. Because the metal layer 150 is etched twice according to the process, the remaining metal pattern, which forms the source electrode 153 and drain electrode 152, and signal lines 151, is the same as the semiconductor pattern or smaller except for the channel region, as shown in FIG. 6C.

Figure 7:
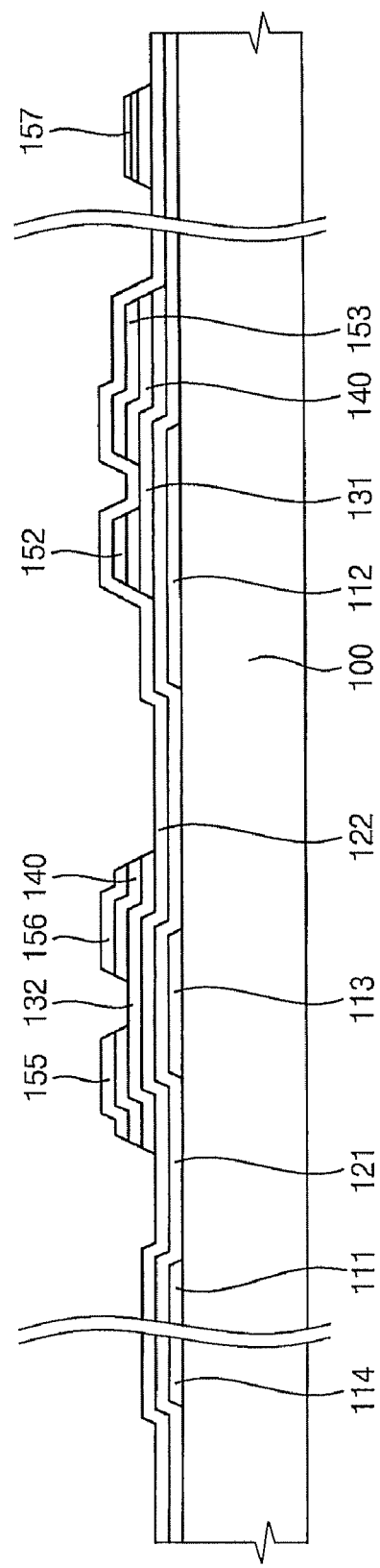

FIG. 7 shows a switching TFT Qs formed on a passivation layer 122 deposited on the driving TFT Qd. A silicon nitride layer as a passivation layer 122, an a-Si layer for the semiconductor layer 132, an n+ a-Si layer for the ohmic contact layer 140, and a metal layer for the source and drain electrodes 155, 156 and the data lines 154 are deposited sequentially and etched away except for the passivation layer 122 by using a similar mask and similar method described above. However, the semiconductor layer 132 of the switching TFT Qs includes an a-Si layer.

Figure 8:
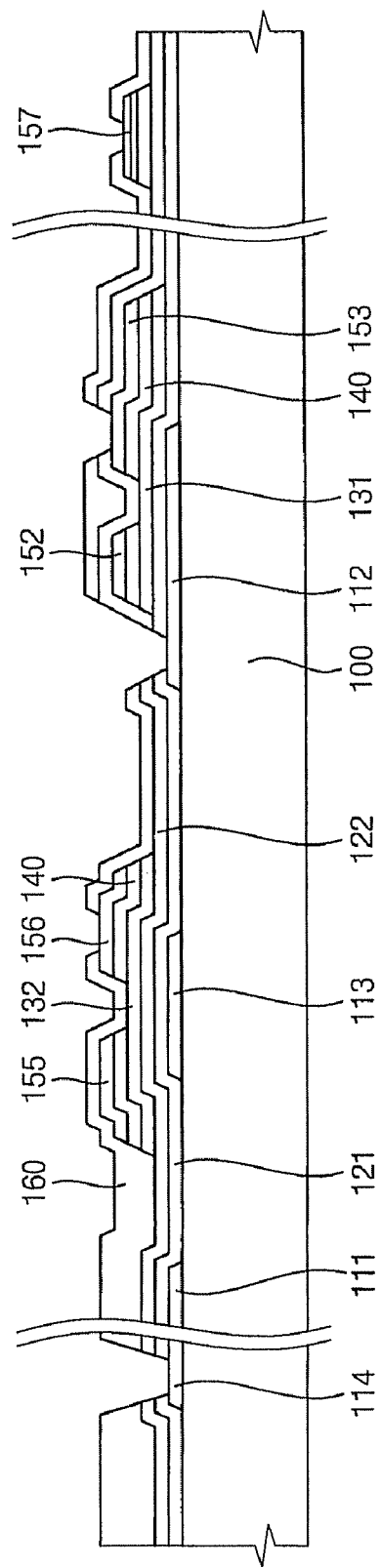

As shown in FIG. 8, a passivation layer 160 for the switching TFT Qs is deposited by a CVD method on the structure shown in FIG. 7, and patterned by using a photo lithographic process to form contact holes. In this case, the gate insulating layer 121 and the passivation layer 122 of the driving TFT Qd are etched away simultaneously on the gate terminal 114 and on a portion of the gate electrode 112 of the driving TFT Qd.

Figure 9:
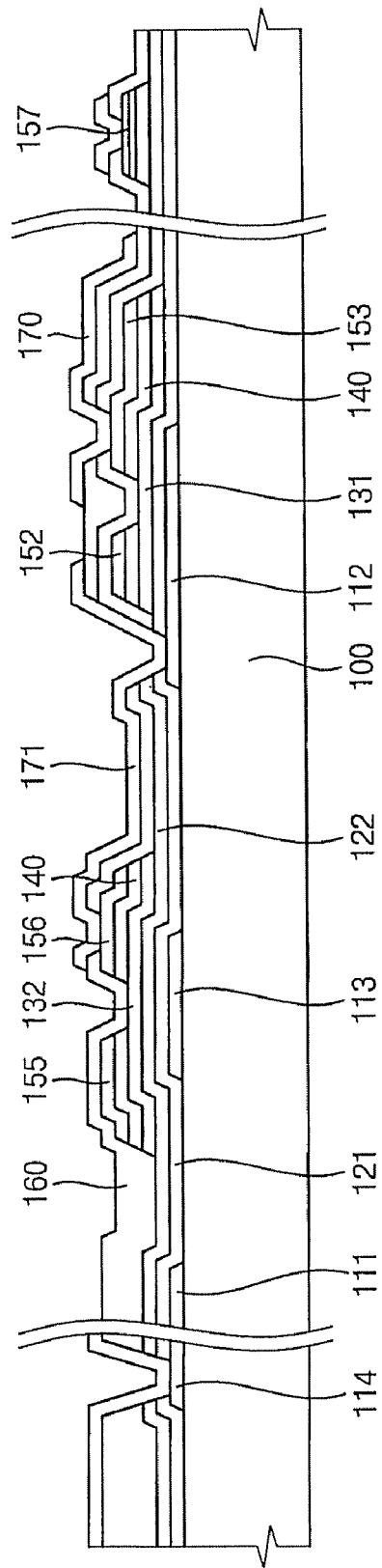

A transparent layer, for example indium tin oxide ("ITO") or indium zinc oxide ("IZO"), or a metal, for example magnesium Mg or aluminum Al, is deposited by a sputtering method on the passivation layer 160 and then patterned by using a photolithographic method. As shown in FIG. 9, a connector 171 connected between the gate electrode 112 of the driving TFT Qd and the drain electrode 156 of the switching TFT Qs, a pixel electrode 170 connected to the drain electrode 153 of the driving TFT Qd, a data pad connected to the terminal 157 of the data line 154, and a gate pad connected to the terminal 114 of the gate line 111 are formed through the contact holes.

Finally, an insulating partition layer is coated or deposited on the passivation layer 160 and the pixel electrode 170. The insulating partition layer is then patterned around the pixel electrode 170 as in FIG. 3 to form the insulating partition 180. The OLED material 200 is formed in an opening area on the pixel electrode 170 and then a common electrode (not shown) as a cathode of the OLED device is formed on the opposite side of the pixel electrode 170.

Referring to FIG. 10 through FIG. 15, an exemplary display apparatus and an exemplary method of manufacturing thereof according to another exemplary embodiment of this invention will be described below.

Figure 10:
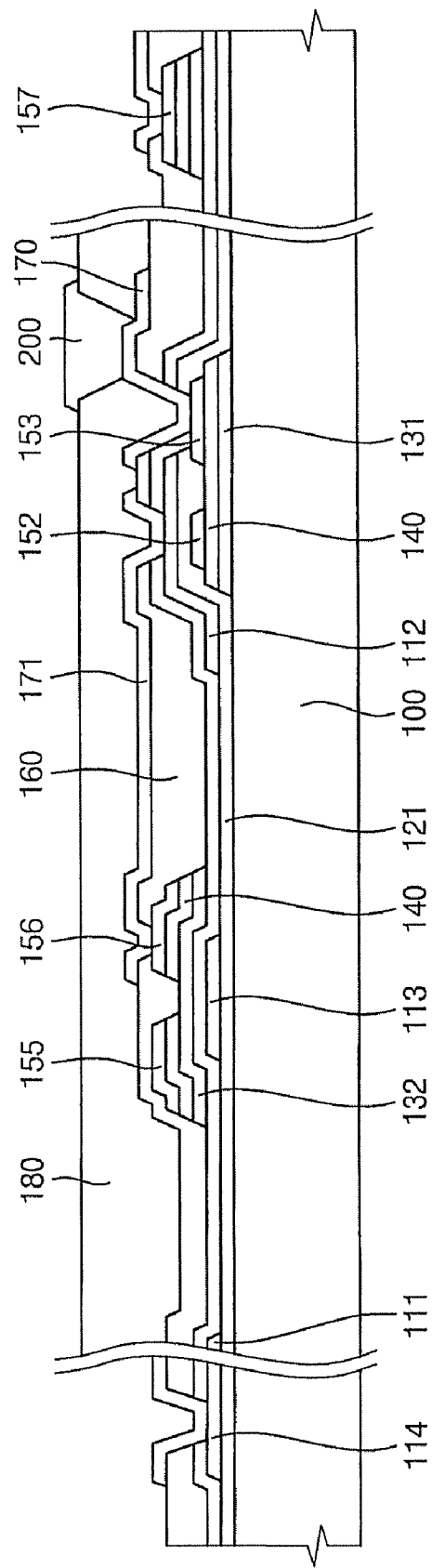
FIG. 10 is a cross sectional view of the exemplary OLED display apparatus taken along line I-I' shown in FIG. 2 according to another exemplary embodiment of this invention modified from the exemplary display apparatus shown in FIG. 3.

FIG. 10 shows a cross sectional view of an exemplary embodiment of the present invention.

Similar to the first exemplary embodiment shown in FIG. 3, most of the elements shown in FIG. 10 have substantially the same function as those of the first exemplary embodiment except that the driving TFT Qd is a top-gate type TFT, where a gate electrode is on a gate insulating layer, while the driving TFT of the first exemplary embodiment is a bottom gate type TFT. As shown in FIG. 10, the gate insulating layer 121 is formed on the semiconductor layer 131, ohmic contact layer 140, and the source electrode 152 and the drain electrode 153, and the semiconductor layer 131, ohmic contact layer 140, and the source electrode 152 and the drain electrode 153, and the gate insulating layer 121 are formed under the gate electrode 112. This type of TFT is called a top-gate type TFT.

A semiconductor layer 131 constituted by a microcrystalline silicon layer or a polycrystalline silicon layer is formed on the insulating substrate 100, which may include an silicon oxide layer (not shown) to block ions from the glass substrate under the semiconductor layer 131. The ohmic contact layer 140, the source electrode 152 and the drain electrode 153 are formed on the semiconductor layer 131, and the width of the ohmic contact layer 140, and the source and drain electrodes 152, 153 are substantially the same as that of the semiconductor layer 131 at any point or less. A gate insulating layer 121 of the driving TFT Qd is formed on the source electrode 152 and the drain electrode 153, and on the semiconductor layer 131. The gate insulating layer 121 may be further formed on the exposed portions of the substrate 100. A gate electrode 112 of the driving TFT Qd which is overlapped with the semiconductor layer 131, a gate electrode 113 of the switching TFT Qs, and gate lines 111 and a gate terminal 114 are formed on the gate insulating layer 121.

While the driving TFT Qd is a top gate type TFT, the switching TFT Qs is a bottom gate type TFT. An insulating layer, such as a silicon nitride layer, is formed on the gate line 111, the gate terminal 114, and the gate electrode 113 of the switching TFT Qs and the gate electrode 112 of the driving TFT Qd. A semiconductor layer 132, such as an a-Si layer, is formed on the insulating layer and overlapped with the gate electrode 113. A source electrode 155, a drain electrode 156, a data signal line 154 (shown in FIG. 2), and a data terminal 157 are formed on the semiconductor layer 132, and the width of the source electrode 155, the drain electrode 156, the data signal line 154 (shown in FIG. 2), and the data terminal 157 are substantially the same as or less than that of the semiconductor layer 132 at any point.

A passivation layer 160, such as a silicon nitride layer, is formed on the switching TFT Qs. The passivation layer 160 has contact holes located on the drain electrode 156 of the switching TFT Qs, on the gate electrode 112 of the driving TFT Qd, on the drain electrode 153 of the driving TFT Qd, on the gate terminal 114, and on the data terminal 157.

A connector 171, a pixel electrode 170, and other patterns on the gate terminal 114 and the data terminal 157 make contacts with the switching TFT Qs, the driving TFT Qd, and the gate and data lines 111, 154 through the contact holes. The material of the connector 171 and the pixel electrode 170 is a transparent conductive metal, or an opaque metal. An insulating partition 180 is formed around the pixel electrode 170 and the OLED material 200 is formed in an opening area of the pixel electrode 170.

FIG. 11A through FIG. 15 show an exemplary manufacturing method of the exemplary display apparatus shown in FIG. 10 according to another exemplary embodiment of the present invention.

Figure 11A:
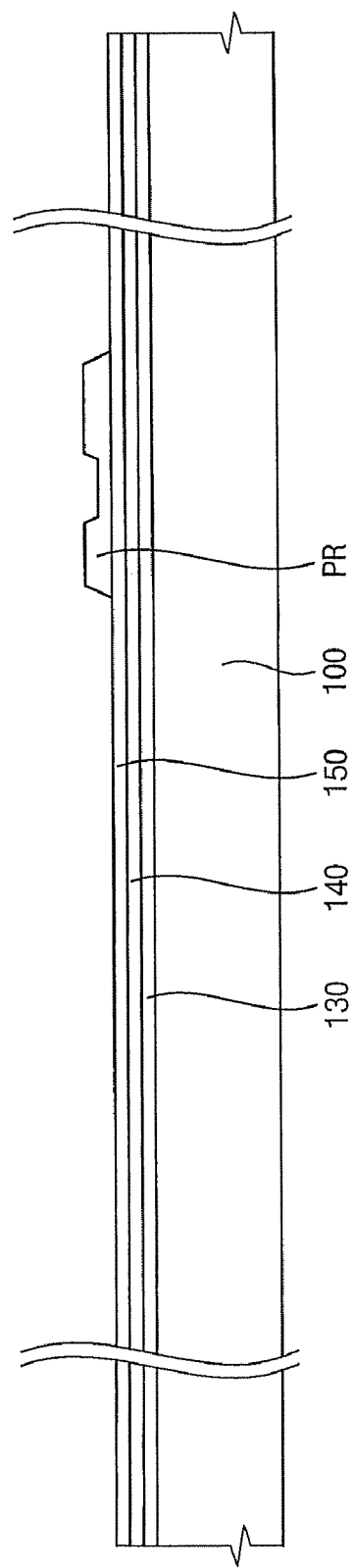
FIG. 11A through FIG. 15 illustrate the exemplary method of manufacturing the exemplary display apparatus shown in FIG. 10 by cross sectional views.

As shown in FIG. 11A, an a-Si layer 130 for the semiconductor layer 131 is deposited on the substrate 100. In order to change the crystalline structure of the a-Si layer 130 to a polycrystalline silicon layer or a microcrystalline silicon layer, the a-Si layer 130 requires treatments such as those described in the previous method, for example, solid phase crystallization ("SPC") method, rapid thermal annealing ("RTA") method, excimer laser annealing ("ELA") method, etc.

Figure 11B:
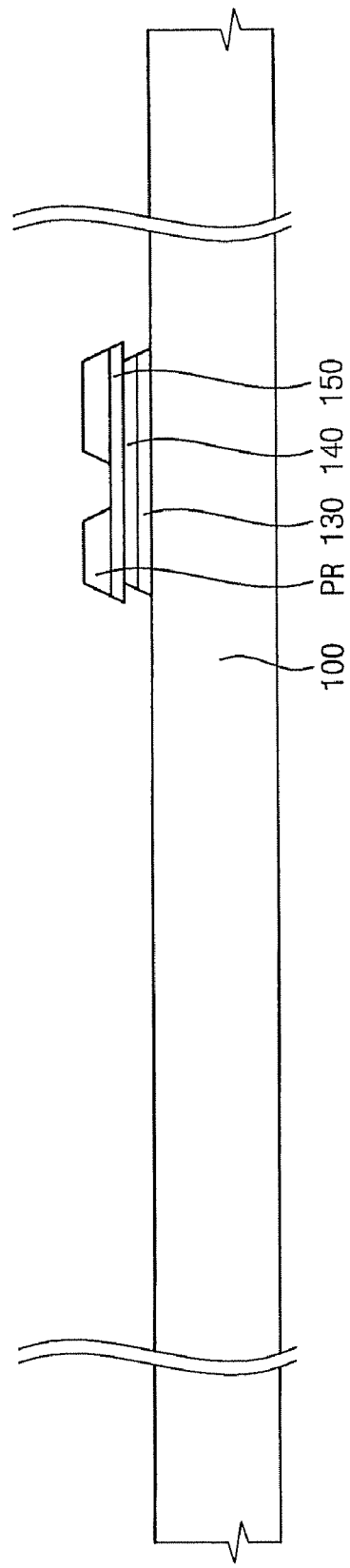

An n+ a-Si layer as an ohmic contact layer 140 is deposited on the microcrystalline silicon layer or the poly crystalline silicon layer by chemical vapor deposition ("CVD") method. A metal layer 150, for example Mo, Ti, Mo/Al/Mo or Cr, is deposited on the ohmic contact layer 140 by sputtering method. As shown in FIGS. 11A to 11C, the source electrode 152 and drain electrode 153 of the driving TFT Qd, the semiconductor layer 131, and the ohmic contact layer 140 are patterned by a single photolithographic process as in the prior embodiment.

FIG. 11A shows the step after exposing by using a mask similar to the first exemplary embodiment and developing the photo resist layer PR.

FIG. 11B shows the step where the metal layer 150, the ohmic contact layer 140, and the semiconductor layer 130 are etched by wet or dry etching method and the photo resist pattern PR is sequentially etched back.

FIG. 11C shows the step where the metal layer 150 and the ohmic contact layer 140 are etched away in the portion on the channel, thus forming the source and drain electrodes 152 and 153 with underlying ohmic contact layers 140 and an exposed semiconductor layer 131.

Because the metal layer 150 is etched twice, according to the exemplary method, the remaining metal pattern, that is the source electrode 152 and drain electrode 153, and signal lines 151, is substantially the same as the semiconductor pattern 131 or smaller except for the channel region.

Figure 12:
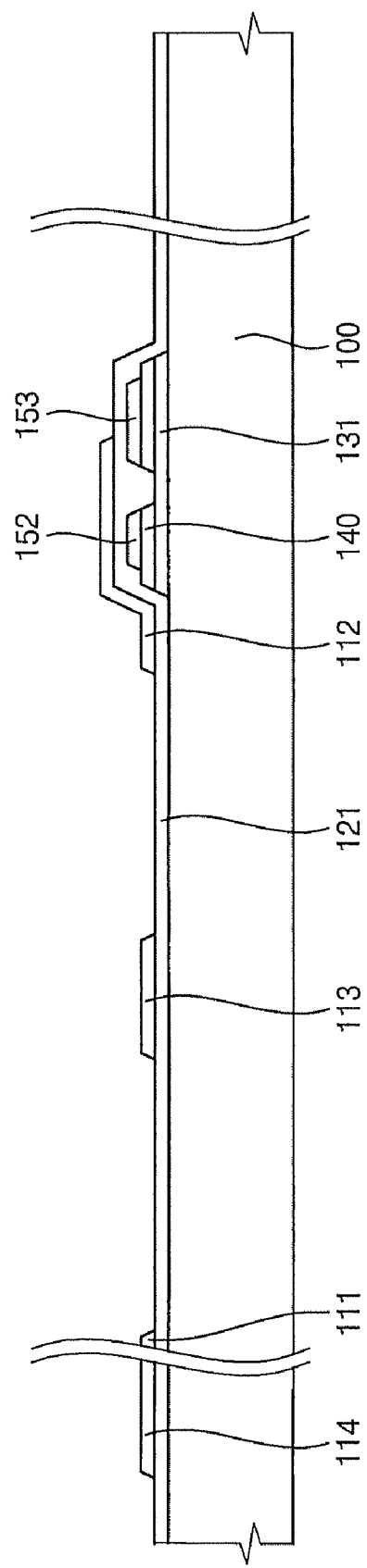

A silicon nitride layer for the gate insulating layer 121 is deposited on the resultant structure as shown in FIG. 12. A metal layer for the gate electrodes 112, 113, gate lines 111, and gate terminals 114 is then formed on the gate insulating layer 121.

Figure 13:
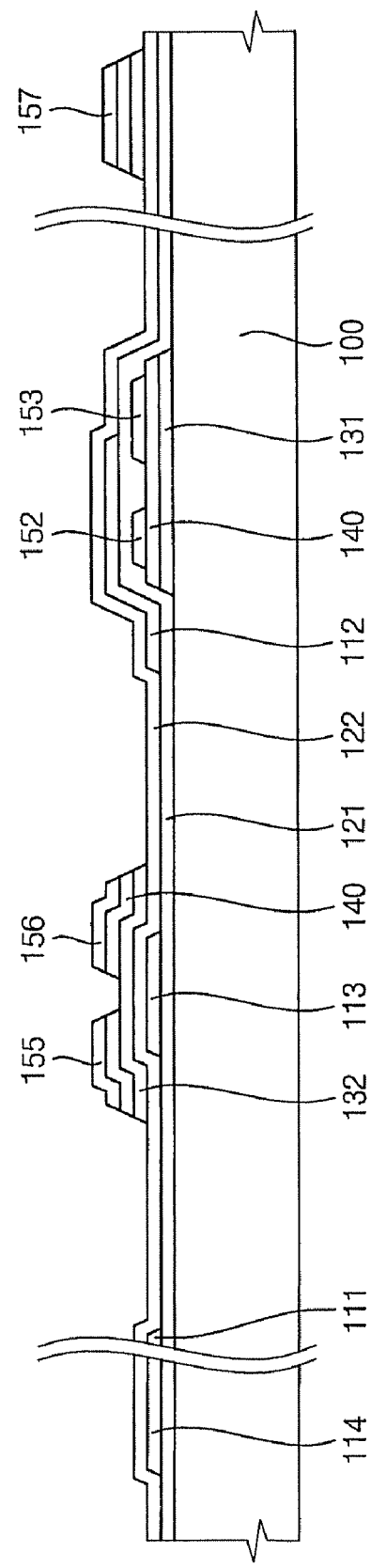

As shown in FIG. 13, a gate insulating layer 122 of the switching TFT Qs, such as a silicon nitride layer, an a-Si layer for the semiconductor layer 132, an n+ a-Si layer for the ohmic contact layer 140, and a metal layer for the source and drain electrodes 155, 156 and the data lines 154 and data terminals 157 are deposited sequentially and etched away except for the gate insulating layer 122 of the switching TFT Qs by using a similar mask and similar method described above and shown in FIGS. 11A to 11C, a photolithographic process. As a result of the photolithographic process, the switching TFT Qs shown in FIG. 13, which shows the source electrode 155 and the drain electrode 156 of the switching TFT Qs, and the data line 154 and data terminal 157, is completed.

Figure 14:
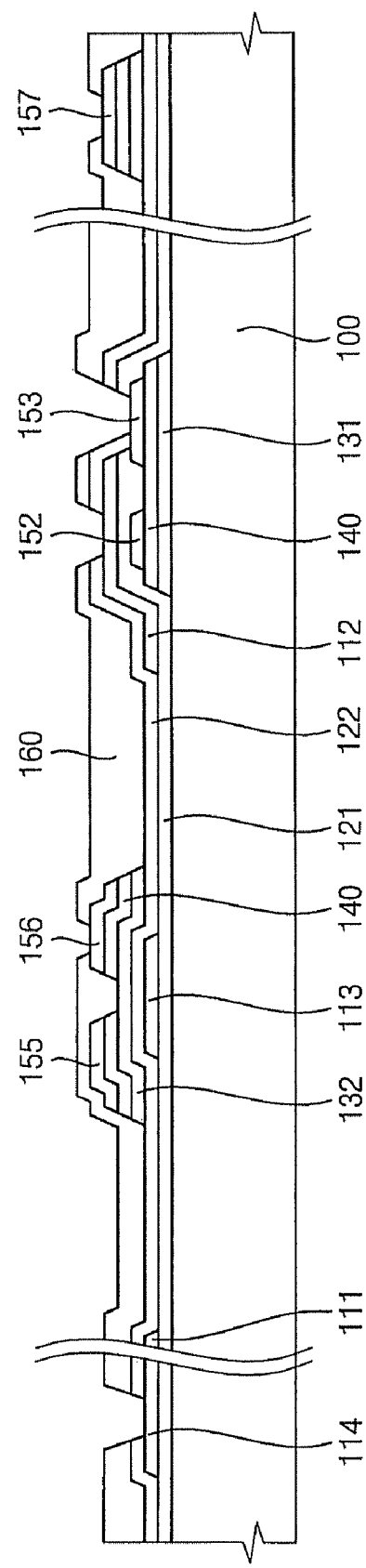

As shown in FIG. 14, a passivation layer 160 for the switching TFT Qs, which may be a silicon nitride layer or an organic layer, is deposited by CVD method or coated on the structure shown in FIG. 13, and patterned by using a photolithographic process to form contact holes. In this case, the gate insulating layer 121 of the driving TFT Qd and the gate insulating layer 122 of the switching TFT Qs are etched away simultaneously on the gate terminal 114 and a portion of the gate electrode 112 of the driving TFT Qd, and the passivation layer 160 is etched away on the drain electrode 156 of the switching TFT Qs and on the data terminal 157.

Figure 15:
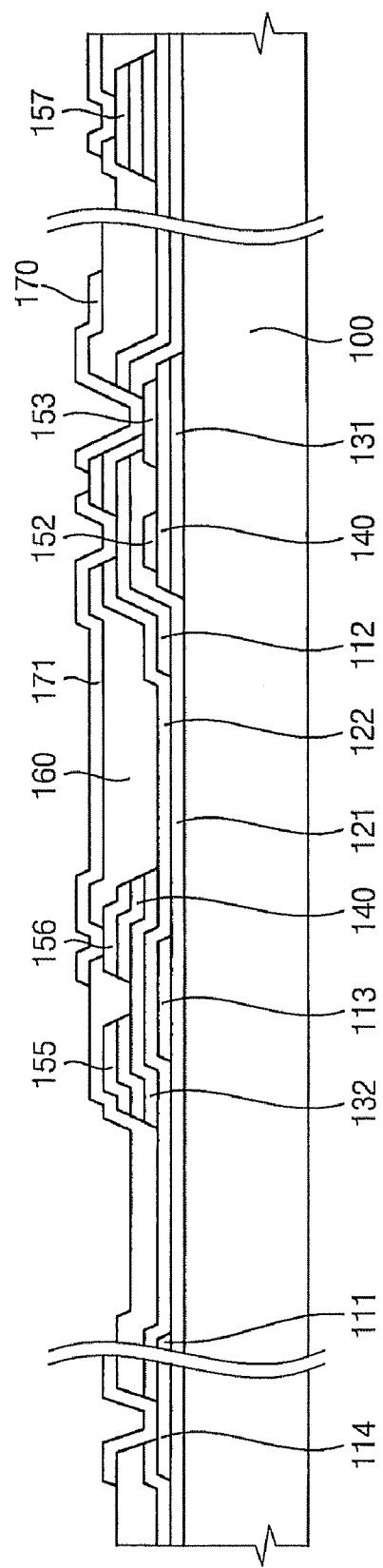

As shown in FIG. 15, a transparent layer, such as ITO or IZO, or a metal, for example Mg or Al, is deposited by a sputtering method on the passivation layer 160 and then patterned by using a photolithographic method. A connector 171 connected between the gate electrode 112 of the driving TFT Qd and the drain electrode 156 of the switching TFT Qs, a pixel electrode 170 connected to the drain electrode 153 of the driving TFT Qd, a data pad on the data terminal 157, and a gate pad on the gate terminal 114 are make contact with the switching TFT Qs, the driving TFT Qd, or the data or gate terminals 157, 114 through the contact holes.

Finally, with reference again to FIG. 10, an insulating partition layer 180 is coated or deposited on the passivation layer 160 and the pixel electrode 170 and the insulating partition layer 180 is then patterned to make an opening area on the pixel electrode 170 similar to the first exemplary embodiment of FIG. 3. The OLED material 200 is formed in the opening area on the pixel electrode 170 and then a common electrode (not shown) as a cathode of the OLED device is formed on the opposite side of the pixel electrode 170.

While the invention has been shown and described with reference to certain preferred exemplary embodiments thereof, it will be understood by those skilled in the art that various changes in form and details may be made therein without departing from the spirit and scope of the invention as defined by the appended claims.

What is claimed is:

1. A method of manufacturing a display apparatus, the method comprising:
    forming a first gate electrode and a second gate electrode on a substrate;
    forming a first insulating layer on the substrate, the substrate including the first gate electrode and the second gate electrode;
    forming a first semiconductor layer, a first source electrode and a first drain electrode using a first mask on the substrate, the substrate including the first insulating layer, the first semiconductor layer overlapping a portion of the first gate electrode on the first insulating layer, the first source electrode and the first drain electrode disposed on the first semiconductor layer;
    forming a second insulating layer on the substrate, the substrate including the first source electrode and the first drain electrode;
    forming a second semiconductor layer, a second source electrode and a second drain electrode using a second mask on the substrate, the substrate including the second insulating layer, the second semiconductor layer overlapping a portion of the second gate electrode on the second insulating layer, the second source electrode and the second drain electrode disposed on the second semiconductor layer;
    forming a connector connecting the first gate electrode to the second drain electrode; and
    forming a pixel electrode,
    wherein the first semiconductor layer, the first source electrode, and the first drain electrode are made by a photolithographic process, and/or the second semiconductor layer, the second source electrode, and the second drain electrode are made by a photolithographic process.

2. The method of manufacturing a display apparatus of claim 1, wherein forming the first semiconductor layer comprises forming an amorphous silicon layer and crystallizing the amorphous silicon layer to a poly crystalline silicon layer.

3. The method of manufacturing a display apparatus of claim 2, wherein the first semiconductor layer, the first source electrode, and the first drain electrode are made by a photolithographic process using a photo mask, and the second semiconductor layer, the second source electrode, and the second drain electrode are made by a photolithographic process using a photo mask.

4. The method of manufacturing a display apparatus of claim 3, further comprising forming a third insulating layer on the second source electrode and the second drain electrode and forming contact holes in the third insulating layer before forming the connector and forming the pixel electrode.

5. The method of manufacturing a display apparatus claim 4, wherein crystallizing the amorphous silicon layer to a poly crystalline silicon layer is performed by a solid state crystallization method.

* * * * *